United States Patent [19]

Acker

[11] 4,326,168
[45] Apr. 20, 1982

[54] SIGNAL MONITOR SYSTEM

[75] Inventor: William F. Acker, Seminole, Fla.

[73] Assignee: Honeywell Inc., Minneapolis, Minn.

[21] Appl. No.: 101,961

[22] Filed: Dec. 10, 1979

Related U.S. Application Data

[62] Division of Ser. No. 829,705, Sep. 1, 1977, Pat No. 4,207,523.

[51] Int. Cl.³ .............................................. H03K 5/01
[52] U.S. Cl. .................................. 328/162; 307/359; 328/175
[58] Field of Search .............. 307/264, 356, 358, 359, 307/360; 328/162, 164, 165, 175

[56] References Cited

U.S. PATENT DOCUMENTS 3,665,326 5/1972 Sullivan ........................ 307/359 X
4,097,860 6/1978 Araseki et al. .................. 307/359 X

*Primary Examiner*—John Zazworsky
*Attorney, Agent, or Firm*—Theodore F. Neils

[57] ABSTRACT

An offset adjustment system is disclosed to correct for the presence of a constant or slowly varying additive component in an incoming analog baseband signal at the receiver end of a digitally based communications channel based on a level crossing detector identifying certain data samples in connection with a preselected value.

7 Claims, 3 Drawing Figures

SIGNAL MONITOR SYSTEM

The invention herein described was made in the course of, or under a contract, or subcontract thereunder, with the Department of the Air Force.

This is a division of application Ser. No. 829,705 filed Sept. 1, 1977, now U.S. Pat. No. 4,207,523 issued June 10, 1980. That patent is incorporated herein by reference.

BACKGROUND OF THE INVENTION

The present invention relates to an offset adjusting feedback system for adjusting offset in an analog signal derived from a digital signal. A typical use would be in digitally based communication channel receivers or monitors.

Communication channels can be entirely analog extending from the information source to the transmitter, and then along the channel link to the receiver, and finally to the user of the transmitted information. Communication channels can also be digitally based, either totally or partially. A typical situation is to have a digital information source but where the information is sent in analog form over an analog channel link to a receiver which reconverts the information to a digital format.

Among the types of signal degradation which can be encountered in a digitally based communications channel is the incorporation in the analog signal in the channel of a constant or nearly constant additive signal termed an offset. For example, in a three-level partial response digitally based communications channel, the incoming baseband analog signal to the receiver detectors may not be symmetrical about points in this signal intended to equal the center expected incoming signal level, usually as a result of distortion in the generating or processing of signals in the digitally based communications channel. The result is that there appears to be an offset between the center expected incoming signal level and the points in the incoming baseband analog signal intended to equal the center expected incoming signal level. For proper monitor system performance, the points in the incoming baseband analog signal which are intended to be at the center expected incoming signal level should be maintained there for at least two reasons.

First, the phasing of the data samples sought to be corrected in a phase correction feedback loop will not fully correct if the intended center expected incoming signal level points in the incoming baseband analog signal do not occur at the center expected incoming signal level. And secondly, values obtained from the incoming baseband analog signal interpreted as being the intended upper and lower expected incoming signal levels will not reflect the actual lower and upper expected incoming signal levels being measured with respect to the center expected incoming signal level if the intended center expected incoming signal level points in the incoming baseband analog signal are not at the center expected signal level.

SUMMARY OF THE INVENTION

An offset adjustment system is provided to correct for the presence of a constant or slowly varying additive component in an incoming analog baseband signal at the receiver end of a digitally based communications channel. A level crossing detector identifies those data samples for which there is an indication that the corresponding portion of the incoming baseband analog level of the signal crosses a preselected value. The observed values of such data samples are compared with the preselected value. If the preselected and observed values differ from one another, a slow acting feedback loop acts to correct the discrepancy.

BRIEF DESCRIPTION OF THE DRAWINGS

FIG. 1 is a system diagram of the present invention,

DESCRIPTION OF A PREFERRED EMBODIMENT

The preferred embodiment is described in the context of a three-level partial response digitally based communications channel. The offset is measured relative to the center expected signal level which is assumed to be zero volts.

The causes of offset in the input baseband analog signal are usually relatively slowly changing if they are changing at all. Thus, a slow-acting feedback loop is satisfactory for countering offsets of this nature in the incoming baseband analog signal. This is accomplished in the monitor system of FIG. 1 by using a combining circuit, 72, to combine the incoming baseband analog signal with a signal, the OFFSET ADJUST signal, which is just sufficient to counter any offset occurring in the incoming baseband analog signal. Combining circuit 72 can be provided by a well-known operational amplifier circuit.

The OFFSET ADJUST signal is provided by the components comprising a monitor system offset adjust block, 73, appearing in FIG. 1. Monitor system offset adjust 73 operates in conjunction with the components comprising a monitor system update enable block, 53, and an amplitude range classifier block, 100, to provide the OFFSET ADJUST signal as shown in FIG. 1.

Figure 2:
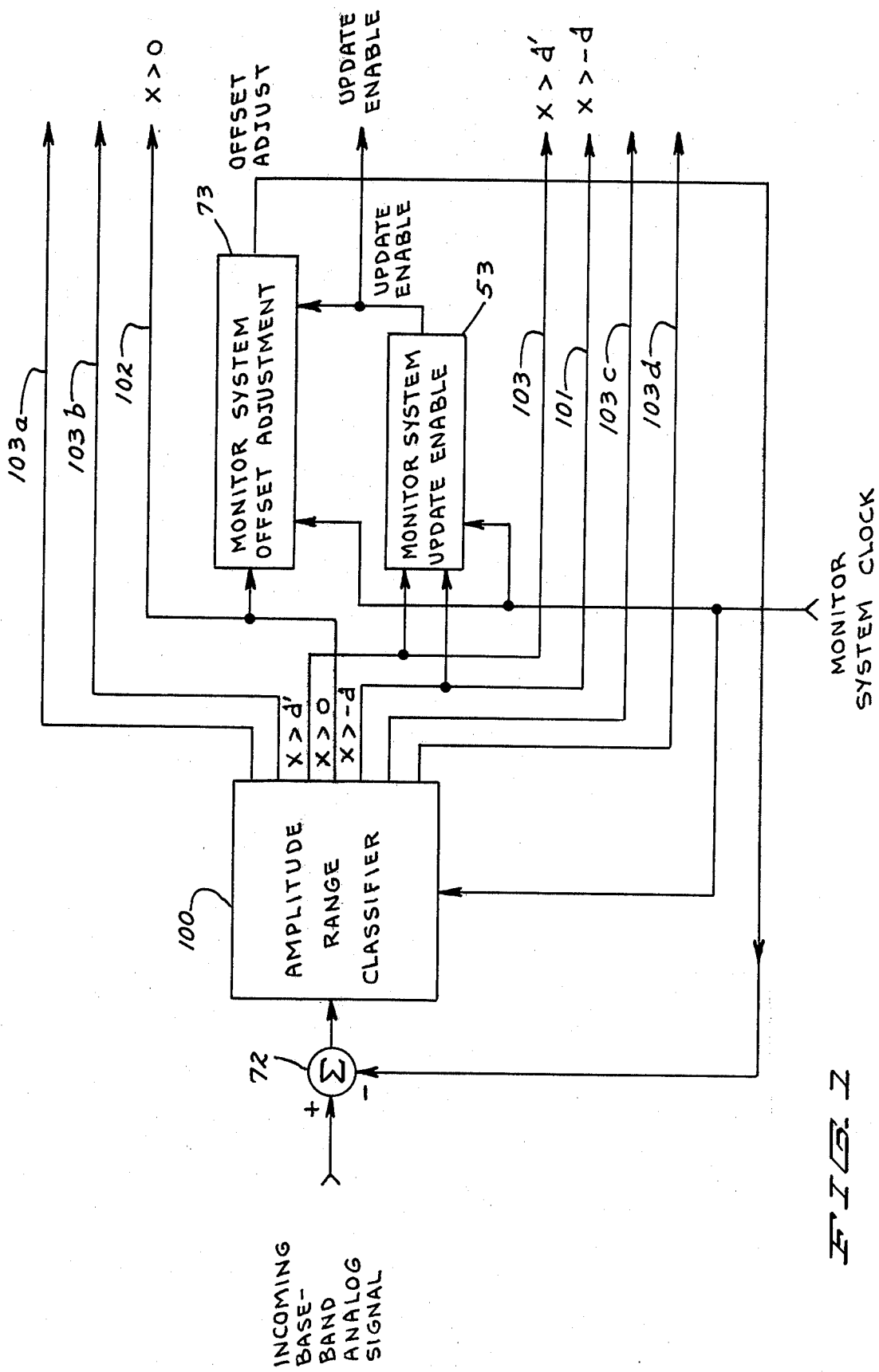
FIG. 2 is a schematic diagram of the level crossing detector portion of the present invention.
Figure 3:
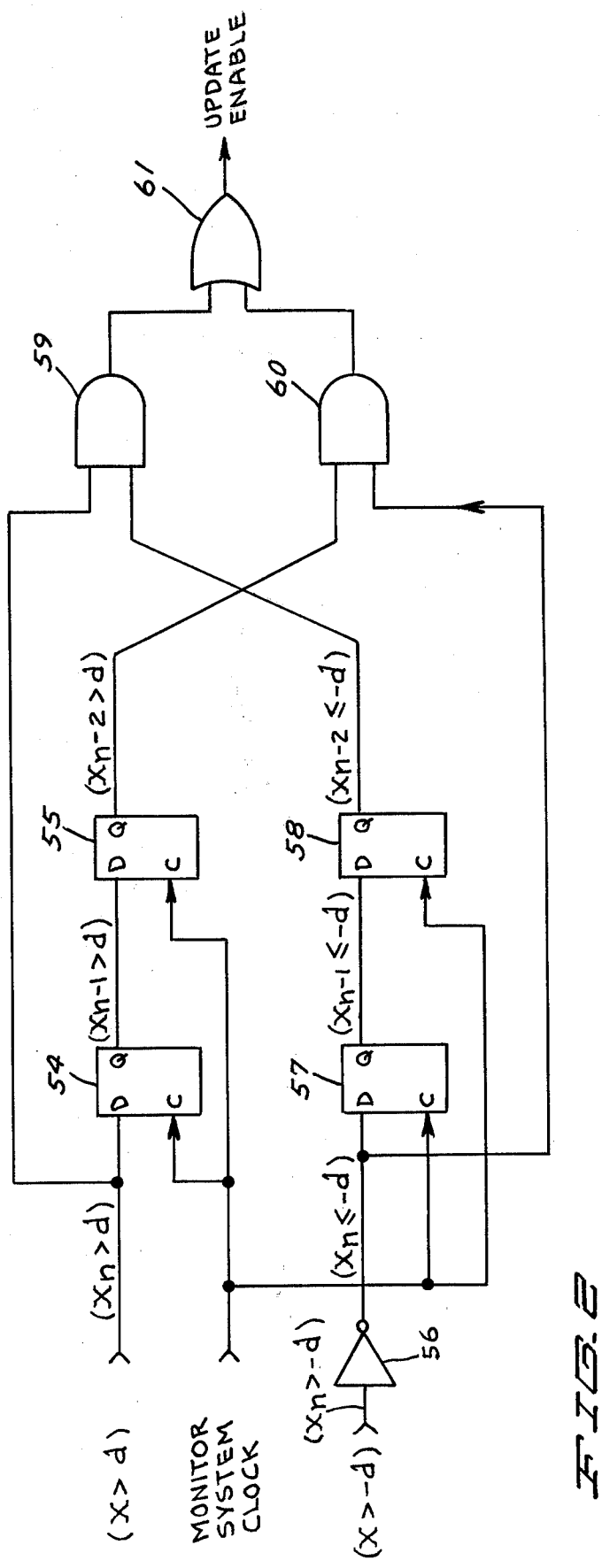
FIG. 3 is a schematic diagram of the offset adjust determination portion of the present invention.
Figure 2:
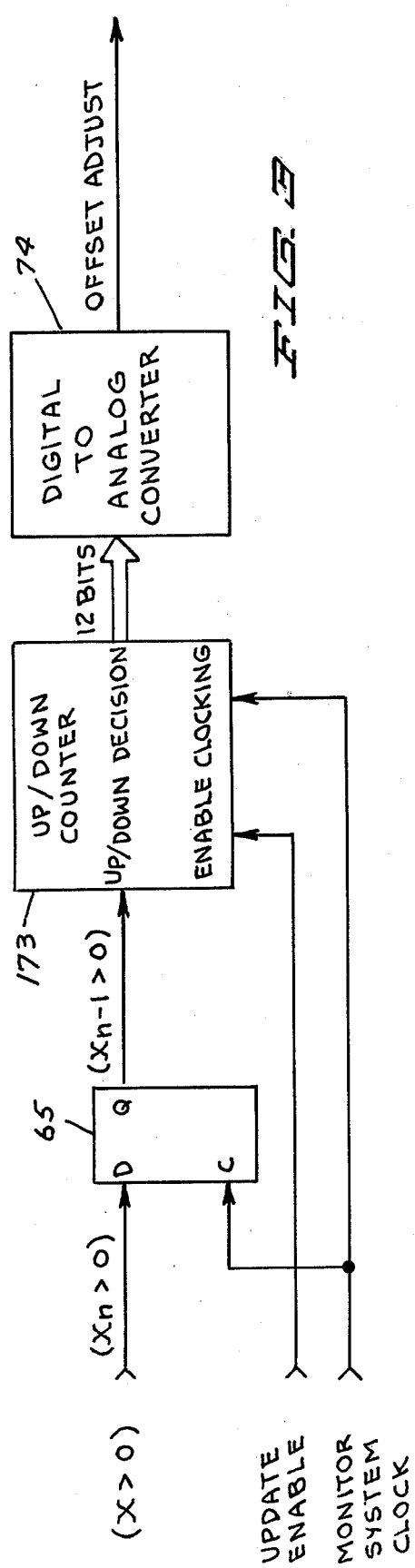

The components comprising monitor system update enable 53 are shown in FIG. 2, and those comprising monitor system offset adjust 73 are shown in FIG. 3.

Turning to FIG. 1, the incoming baseband analog signal enters amplitude range classifier 100 which provides a set of logic signals determined by the amplitude level of the incoming signal at each time of sampling of that signal in the amplitude range classifier 100. These logic signals are produced by comparators, operating in a manner well known in the art, which compare the incoming signal level with various reference levels. Lines 101, 102, and 103 carry signals representing $x > -d$, $x > 0$, and $X > d'$ respectively, where X is the incoming analog signal level at a time of sampling, 0 (zero) is the center expected incoming signal level, and $-d$ and $d'$ are the lower and upper decision levels for determining whether the amplitude of X is closer to the intended upper expected incoming signal level than to zero, or closer to the intended lower expected incoming signal level than to zero, respectively. The signal on each of these lines will assume a logical true value if the incoming signal has a value anywhere in the amplitude ranges exceeding the range boundary associated with that line. If the incoming baseband analog signal is not in an amplitude range exceeding the range boundary associated with one of lines 101, 102, and 103, that line will have a signal assuming a logical false value. Lines 103a, 103b, 103c, and 103d carry similar logic signals for other incoming signal levels for use in other portions of the error detection circuitry. More lines may be necessary depending upon the nature of the error detection system.

The signals $(X > -d)$ and $(X > d')$ are used in monitor system update enable block 53 which comprises a zero crossing detector. In more detail, update enable block 53 operates by noting (i) whether the incoming baseband analog signal was at the lower expected incoming signal level in the baud period previous to the baud period in which the data sample in question appears and whether the incoming signal then proceeds to the upper expected incoming signal level in the baud period following the baud period in which the data sample in question appears, or (ii) whether the incoming baseband analog signal was at the upper expected incoming signal level in the baud period previous to the baud period in which the data sample in question appears and whether the incoming signal then proceeds to the lower expected incoming signal level in the baud period following the baud period in which the data sample in question appears. If so, then the data sample in question, as a countable data sample, will separate a pair of acceptable data samples in such a manner as to provide one or the other of the following patterns: (i) $X_{n-2} = +2d'$, $X_{n-1} = 0$, $X_n = -2d$, or (ii) $X_{n-2} = -2d$, $X_{n-1} = 0$, $X_n = +2d$; where $X_n$ is the level value of incoming baseband signal during baud period n, $X_{n-1}$ is the level value during the baud period immediately preceding baud period n, and $X_{n-2}$ is the level value during the baud period immediately preceding baud period $n-1$. In these equations $-2d$ and $2d'$ are the lower and upper expected incoming signal level values, respectively. The data samples $X_{n-2}$ and $X_n$ form, in each of those instances, a pair of acceptable data samples separated by the countable data sample $X_{n-1}$.

Turning now to FIG. 2, there is provided a logic diagram for a logic system capable of detecting the foregoing sequences of data samples in the stream of data samples obtained from the incoming baseband analog signal, this apparatus comprising the contents of monitor system update enable 53. The incoming logic signals in FIG. 2 have been written as they are obtained from the amplitude range classifier 100 and then these logic signals have been rewritten in FIG. 2 with a counting subscript n to indicate which baud period the logic signal represents.

In FIG. 2, when the logic signal $(X_n > d')$ is true, the amplitude value $X_n$ of the data sample in the $n^{th}$ baud period in the incoming baseband analog signal is nominally at the upper expected incoming signal level $+2d'$ volts. The comparator decision as to whether or not this inequality is satisfied in the $n^{th}$ baud period is correspondingly inserted into a flip-flop, 54. This process is repeated for each baud period. Thus, the information is available as to whether or not this inequality was satisfied in the baud period immediately preceding the current one by virtue of the storage of this information in that preceding baud period in flip-flop 54. Further, the information as to whether this inequality was satisfied or not, two baud periods previous to the current baud period is transferred to and retained in another flip-flop, 55, connected to the output of flip-flop 54. The outputs of flip-flops 54 and 55 are thus the logic signals $(X_{n-1} > d')$ and $(X_{n-2} > d')$ respectively. Flip-flops 54 and 55 thus act as a storage means for retaining information as to whether the incoming analog baseband signal had a value in the high range, i.e. greater than $d'$, during the two baud periods previous to the current baud period.

When the logic signal $(X_{n-1} > -d)$ is false, the current data sample has an amplitude $X_n$ intended to equal the lower expected incoming signal level of $-2d$ volts. Therefore, the logic signal $(X_n > -d)$ is passed through an inverter, 56, to provide the logic signal $(X_n \leq -d)$. This logic signal is stored for the baud period immediately previous to the current one in a flip-flop, 57, and is transferred and retained for two baud periods previous to the current one in another flip-flop, 58, connected to the output of flip-flop 57. The logic signals available at the outputs of flip-flops 57 and 58 are $(X_{n-1} \leq -d)$ and $(X_{n-2} \leq -d)$, respectively. Flip-flops 57 and 58 thus serve as a storage means for retaining information as to whether the incoming analog baseband signal had a value in the low range, i.e. less than or equal to $-d$, during the two baud periods previous to the current baud period.

With this information available from flip-flops 54, 55, 57, and 58, the presence of one of the desired data sample patterns, described above, in the stream of data samples obtained from the incoming baseband analog signal can be detected. Two AND gates, 59 and 60, are used to detect the desired patterns of data samples, each of these AND gates being capable of detecting one of the desired patterns. AND gate 59 detects presence of a countable data sample obtained from the incoming baseband analog signal at a time when this signal is in an increasing pattern. One input to AND gate 59 is supplied with the current baud period logic signal $(X_n > d)$ which indicates whether the current data sample $X_n$ has an amplitude nominally equal to the upper expected incoming signal level of $+2d'$ volts. The other input of AND gate 59 is supplied the logic signal $(X_{n-2} \leq -d)$ which indicates whether the data sample occurring two baud periods previous to the current baud period has an amplitude value that was nominally equal to the lower expected incoming signal level of $-2d$ volts.

If both of these signals supplied to AND gate 59 are true, there is a rising pattern in the incoming baseband analog signal occurring over the current baud period and the past two baud periods and, necessarily, the data sample occurring one baud period previous to the current baud period $X_{n-1}$ must have an amplitude value intended to equal the center expected incoming signal level. AND gate 60, in a similar manner, detects whether the data sample in the baud period previous to the current baud period $X_{n-1}$ has an amplitude value intended to equal the center expected incoming signal level and whether this data sample was obtained from the incoming baseband analog signal during a time this signal was in a decreasing pattern occurring over the current baud period and the two previous baud periods. Hence, AND gate 60 also determines certain data samples to be countable data samples.

Since either of these data sample patterns are to be accepted as indications of countable data samples in the manner and for the purposes set out above, the outputs of AND gates 59 and 60 are supplied to an OR gate, 61. OR gate 61 provides an output signal, UPDATE ENABLE, indicating that one or the other of the pertinent data sample patterns has occurred over the current baud period and the two previous baud periods. Thus, the UPDATE ENABLE signal indicates that the data sample in the previous baud period was a countable data sample, a data sample obtained when an increasing or decreasing pattern incoming baseband analog signal portion passed through the center expected incoming signal level of zero volts.

The operation of monitor system offset adjust 73 will now be explained. Assume that the data sample phasing is correct, but that there is a positive voltage offset in the incoming baseband analog signal. Then the amplitude value X of a data sample, obtained from such an incoming baseband analog signal in a baud period when this signal is intended to be at the center expected incoming signal level of zero volts, will be positive regardless of the slope direction of the incoming baseband analog signal. That is, regardless of whether the incoming baseband analog signal is increasing or decreasing at the time this signal is intended to have an amplitude value equal to the center expected incoming signal level. Therefore, the logic signal $(X>0)$ will have a true value for a data sample obtained from this incoming baseband analog signal in a baud period during which this signal is intended to equal the center expected incoming signal level. Again, in FIG. 3, the logic signal $(X>0)$ is rewritten as $(X_n>0)$ to indicate that the logic signal is with reference to a data sample taken in the current baud period.

When the UPDATE ENABLE signal is true, the data sample in the baud period immediately previous to the current baud period had an amplitude intended to equal the center expected incoming signal level and this previous baud period data sample is, as usual, designated $X_{n-1}$. Hence, flip-flop 65 stores the $(X_n>0)$ logic signal to thereby provide at the output of this flip-flop the logic signal $(X_{n-1}>0)$ which provides amplitude information concerning the data sample taken in the baud period immediately previous to the current one.

So, when the signal UPDATE ENABLE is true, indicating that the data sample taken in the baud period immediately previous to the current one was intended to occur at the center expected incoming signal level, and the logic signal $(X_{n-1}>0)$ is in the true state, the offset in the baseband analog signal is indicated to be positive. An up/down binary counter, 173, in FIG. 3 receives the MONITOR SYSTEM CLOCK signal at its clocking input, the logic signal $(X_{n-1}>0)$ at its up/down decision input for determining counting direction, and the logic signal UPDATE ENABLE at the counter enabling input to enable counter 173 to change the count total kept therein. The MONITOR SYSTEM CLOCK signal acts to cause the count total kept in counter 173 to be altered in each baud period but only when the UPDATE ENABLE signal is in the true state indicating, as just stated, that the data sample provided in the baud period immediately previous to the current one was intended to have an amplitude value equal to the center expected incoming signal level. The direction of this count alteration is controlled by the logic signal $(X_{n-1}>0)$ which directs the counter 173 to increase the count total therein by one count in the baud period whenever this logic signal is in the true state indicating, again as just set out, that the offset in the input basebaud analog signal is positive. If the logic signal $(X_{n-1}>0)$ is in the false state, indicating the offset is negative, the count total in the counter 173 is decreased by one count if the UPDATE ENABLE logic signal is in the true state. The net of the count increases over the count decreases, positive or negative, represents the offset magnitude and its polarity.

There are 12 output taps from counter 173 which present the twelve most significant bits of the count total number in counter 173 to a digital-to-analog converter, 74. As indicated, the offset adjustment loop is to be a slow-acting loop so that the counter 173 again can keep a count total having a maximum of typically $2^{20}$. The count capability beyond $2^{12}$ represents dividing the counts accumulating in counter 173 by $2^8$ before transfer to converter 74 to thereby increase the time constant occurring in the offset adjust loop.

The analog voltage provided at the output of converter 74 forms the signal OFFSET ADJUST. This signal is, as earlier set out, provided to combining circuit 72.

The embodiments of the invention in which an exclusive property or right is claimed are defined as follows:

1. An offset adjustment system for adjusting an input signal to shift about a reference signal level through combining a correction signal with said input signal to form a combined signal provided as a sequence of data samples, said offset adjustment system comprising:

an intended reference level crossing detector means adapted to receive said combined signal, and which has a detector output, said intended reference level crossing detector means being capable of determining, as a countable data sample, those of said data samples which correspond to and which separate members of acceptable pairs of other said data samples, a said pair of said data samples being acceptable if (i) one said member thereof has a value that substantially exceeds that value of said separating data sample corresponding thereto, and if (ii) said member thereof remaining has a value that is substantially less than that value of said separating data sample corresponding thereto, said intended reference level crossing detector means being capable of providing as a detector output signal an indication, at said detector output, as to which of said data samples are said countable data samples;

a comparator means, adapted to receive said combined signal, and which has a comparison output, said comparator means being capable of providing as a comparator output signal an indication, at said comparator output, as to which of said countable data samples have values which occur on a selected side of said reference signal level;

a counter means, connected to both said detector output and said comparator output, and which has a counter means output, said counter means being capable of keeping a count total therein and being capable of being enabled to alter said count total by said detector output signal and said counter means being capable of being directed whether to increase or decrease said count total by said comparator output signal, said counter means being capable of providing at said counter means output, as said correction signal, a signal having a value which indicates whatever value said count total has reached in said counter means; and a combining means connected to said counter means output and adapted to receive said input signal, said combining means being capable of combining said correction signal with said input signal.

2. The apparatus of claim 1 wherein said counter means includes an up/down counter in which said total is contained, said up/down counter having an up/down counter output and said up/down counter being capable of providing at said up/down counter output a parallel m-bit signal indicative of said count total contained in said up-down counter, and wherein said counter means further includes a digital-to-analog converter means having a digital-to-analog converter means input capable of accepting a parallel n-bit signal and having a digital-to-analog converter means output, said digital-to-analog converter means input being connected to said up/down counter output and said digital-to-analog converter means output serving as said counter means output, wherein m and n are positive integers.

3. The apparatus of claim 2 wherein m is greater than n.

4. The apparatus of claim 2 wherein said counter means further includes a storage means having a storage means input and a storage means output, said storage means input being connected to said comparator means output, and wherein said up/down counter has an up/down counter decision input and an up/down counter enable input, said up/down counter decision input being connected to said storage means output and said up/down counter enable input being connected to said intended reference level crossing detector output.

5. The apparatus of claim 4 wherein said storage means comprises a D-type flip-flop having a D-type flip-flop triggering input and a D-type flip-flop output, said D-type flip-flop triggering input serving as said storage means input, said D-type flip-flop output serving as said storage means output.

6. The apparatus of claim 4 wherein said intended reference level crossing detector means includes:

an incoming signal amplitude range classifier for determining whether said data samples are within certain amplitude ranges and having first and second classifier outputs, said incoming signal amplitude range classifier being capable of providing (i) as a first classifier output signal an indication for each said data sample, at said first classifier output whether that said data sample has a value that is within a first selected range, and providing (ii) as a second classifier output signal an indication for each said data sample, at said second classifier output, whether that said data sample has a value that is within the second selected range;

a high range storage means having a high range storage means input and a high range storage means output, said high range storage means being capable of providing as a high range storage means output signal an indication, at said high range storage means output, whether a said data sample, preceding that said data sample corresponding to a current value of said first classifier output signal, had a value that was within said selected range, said high range storage means input being connected to said first classifier output;

a low range storage means having a low range storage means input and a low range storage means output, said low range storage means being capable of providing as a low range storage means output signal an indication at said low range storage means output, whether a said data sample, preceding that said data sample corresponding to a current value of said classifier output signal, had a value that was within said second selected range, said low range storage means input being connected to said second classifier output;

a rising pattern AND logic gate having first and second rising pattern AND logic gate inputs and a rising pattern AND logic gate output, said first rising pattern AND logic gate input being connected to said first classifier output and said second rising pattern AND logic gate input being connected to said low range storage means output;

a falling pattern AND logic gate having first and second falling pattern AND logic gate inputs and a falling pattern AND logic gate output, said first falling pattern AND logic gate input being connected to said second classifier output and said second falling pattern AND logic gate output being connected to said high range storage means output; and a combining OR logic gate having first and second combining OR logic gate inputs and a combining OR logic gate output, said first combining OR logic gate input being connected to said falling pattern AND logic gate output, said second combining OR logic gate input being connected to said rising pattern AND logic gate output, and said combining OR logic gate output serving as said intended crossing level detector output.

7. The apparatus of claim 6 wherein m is greater than n.

* * * * *